(12) United States Patent
Chatty et al.

(10) Patent No.: US 7,138,313 B2
(45) Date of Patent: Nov. 21, 2006

(54) METHOD FOR CREATING A SELF-ALIGNED SOI DIODE BY REMOVING A POLYSILICON GATE DURING PROCESSING

(75) Inventors: Kiran V. Chatty, Williston, VT (US); Robert J. Gauthier, Jr., Hinesburg, VT (US); Mujahid Muhammad, Essex Junction, VT (US); Christopher S. Putnam, Hinesburg, VT (US)

(73) Assignee: International Business Machines Corporation, Armonk, NY (US)

( * ) Notice: Subject to any disclaimer, the term of this patent is extended or adjusted under 35 U.S.C. 154(b) by 63 days.

(21) Appl. No.: 10/708,912

(22) Filed: Mar. 31, 2004

(65) Prior Publication Data

US 2005/0227418 A1    Oct. 13, 2005

(51) Int. Cl.
   *H01L 21/8234* (2006.01)
(52) U.S. Cl. .................. 438/237; 438/180; 438/231
(58) Field of Classification Search .............. 438/183, 438/220, 208, 237, 328, 380, 229–232, 180–181, 438/184–185, 233
   See application file for complete search history.

(56) References Cited

U.S. PATENT DOCUMENTS

| | | | |
|---|---|---|---|
| 5,629,544 A | 5/1997 | Voldman et al. | |
| 5,811,857 A | 9/1998 | Assaderaghi et al. | |
| 6,232,163 B1 | 5/2001 | Voldman et al. | |
| 6,245,600 B1 | 6/2001 | Geissler et al. | |
| 6,294,412 B1 * | 9/2001 | Krivokapic | 438/155 |
| 6,576,958 B1 | 6/2003 | Ker et al. | |
| 6,589,823 B1 | 7/2003 | Beebe et al. | |
| 6,590,264 B1 | 7/2003 | Ker et al. | |
| 6,936,895 B1 * | 8/2005 | Manna et al. | 257/355 |
| 2002/0119608 A1 | 8/2002 | Ko et al. | |
| 2003/0080386 A1 | 5/2003 | Ker et al. | |

* cited by examiner

*Primary Examiner*—Thanhha S. Pham
(74) *Attorney, Agent, or Firm*—Gibb I.P. Law Firm, LLC; Anthony Canale

(57) ABSTRACT

A method of forming a self-aligned SOI diode, the method comprising depositing a protective structure over a substrate; implanting a plurality of diffusion regions of variable dopant types in an area between at least one pair of isolation regions in the substrate, the plurality of diffusion regions separated by a diode junction, wherein the implanting aligns an upper surface of the diode junction with the protective structure; and removing the protective structure. The method further comprises forming a silicide layer over the diffusion regions and aligned with the protective structure. The protective structure comprises a hard mask, wherein the hard mask comprises a silicon nitride layer. Alternatively, the protective structure comprises a polysilicon gate and insulating spacers on opposite sides of the gate. Furthermore, in the removing step, the spacers remain on the substrate.

20 Claims, 7 Drawing Sheets

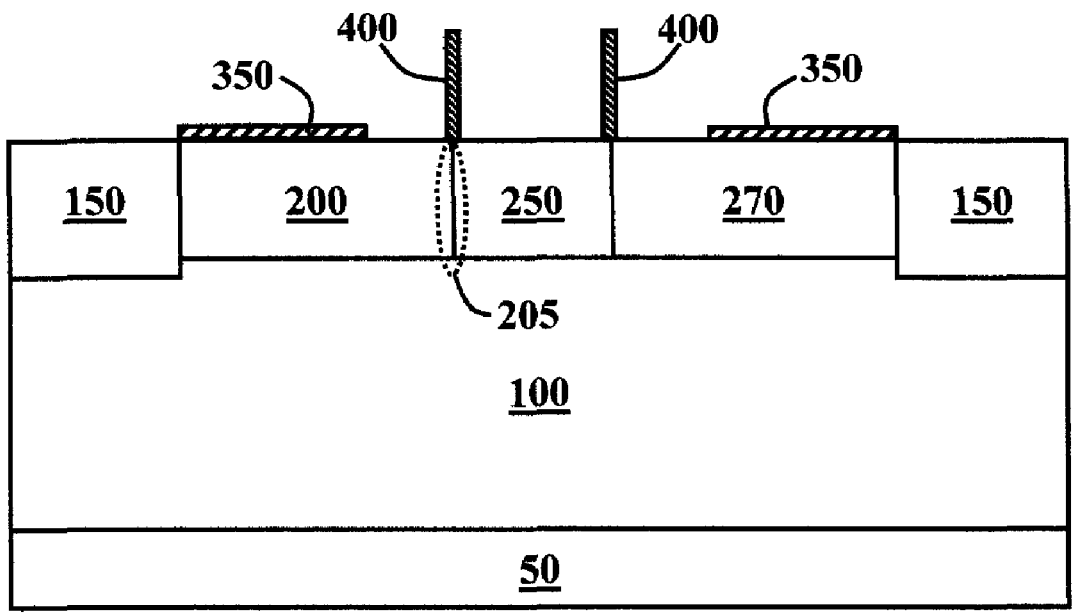
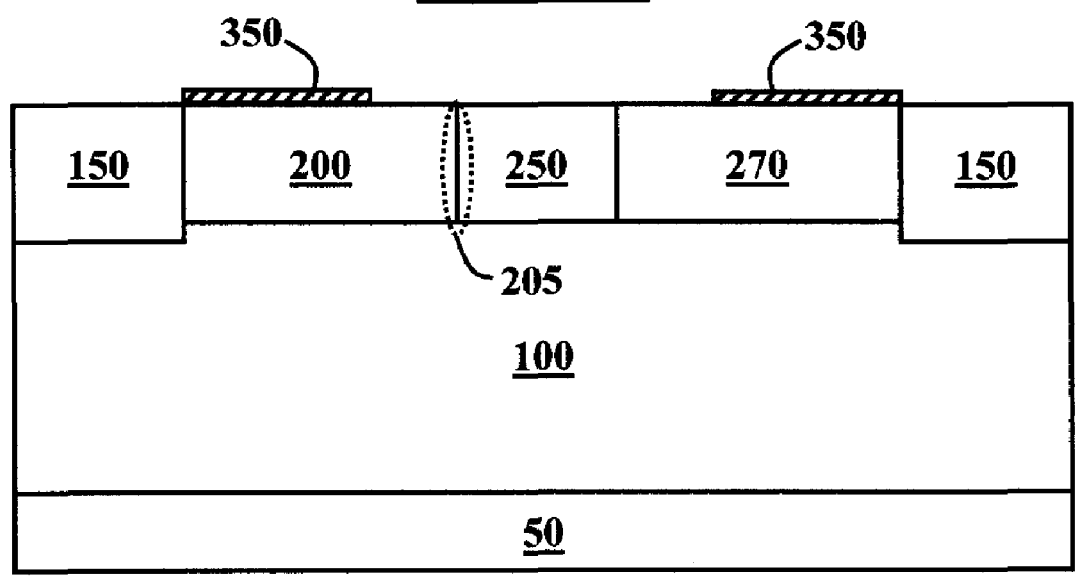

METHOD FOR CREATING A SELF-ALIGNED SOI DIODE BY REMOVING A POLYSILICON GATE DURING PROCESSING

BACKGROUND OF INVENTION

1. Field of the Invention

The invention generally relates to integrated circuit technologies, and more particularly to silicon on insulator, electrostatic discharge diodes incorporated in field effect transistor structures.

2. Description of the Related Art

Conventionally, diodes offered in silicon on insulator (SOI) technologies require the use of polysilicon to serve as a self-aligning mask for the anode/cathode and to block silicide formation, preventing shorting between the anode and cathode regions of the device. The standard practice is for the polysilicon gate to remain after processing is completed. However, this approach has two disadvantages; gate oxide breakdown limitations and increased capacitance loading.

An example of a conventional diode structure is illustrated in FIG. 1, wherein the diode is formed on a single area of silicon over a buried oxide insulator 10 over a substrate 5, and in between the shallow trench isolation regions (STI) 15. The polysilicon gate 30 is used to separate the anode and cathode and to provide silicide blocking. The anode connects to the P+ region 20 of the diode, while the cathode connects to the N+ region 27 of the diode. An N− region 25 (often referred to as the n-type body region), which is positioned under the gate 30, separates the P+ 20 and N+ 27 regions from one another. A pair of insulating spacers 40 is attached to the sidewalls of the gate 30, and a layer of silicide 35 is deposited over the upper surfaces of the gate 30, P+ region 20, and N+ region 27.

A typical diode-based ESD protection circuit is provided in FIG. 2, with the diode structures shown in the encircled regions. As shown, the gate of the diode connects to the cathode. Also, an overlap capacitor is formed between the anode diffusion and the gate. During electrostatic discharge (ESD) events, large voltages can develop between the pad and ground, which can lead to gate oxide breakdown. As illustrated in FIG. 2, the diodes are used in the circuit to protect against the Human Body Model/Machine Model (HBM/MM) and Charged Device Model (CDM), which are well-known models of ESD events. resistors may be added in the circuit in order to have the correct output impedance for the desired I/O performance (impedance matching).

U.S. Patent Application No. 2003/0080386 published on May 1, 2003, the complete disclosure of which is herein incorporated by reference, describes creating an ungated SOI diode that has the PN junction formed between lightly doped body implant regions. '386 publication describes using a MOS gate to form the diode as is known in the art for creating an SOI diode. in '386, the P-well and N-well are implanted in separate processing steps and have to be aligned to each other, and the same is true for the P+ and N+ implants in the non-gated diode.

U.S. Pat. No. 6,589,823 issued on Jul. 8, 2003, the complete disclosure of which is herein incorporated by reference, describes adding a backside contact ("plug") to SOI diodes in order to provide a path for heat dissipation. diode is not created in a self-aligned fashion as implant masks for N+ and P+ must be aligned to each other in separate lithographic steps, and the silicide blocking mask must also be aligned after the implants are complete. suggests that the resistance characteristics of the diode may suffer because the silicide region is not proximate to the diode junction.

Thus, there is an identified need for a process of manufacturing an SOI diode which solves gate oxide breakdown limitations, and includes decreased capacitance loading and optimally reduced on-resistance. While the conventional devices and methods are adequate for the purposes they were designed to solve, there remains a need for a novel method for processing a self-aligning low capacitance SOI ESD diode, which does not include a polysilicon gate in the final diode structure.

SUMMARY OF INVENTION

The invention provides a method of forming a non-gated silicon on insulator diode in a semiconductor substrate, the substrate including a plurality of isolation regions formed therein, the method comprising forming a first structure on an upper surface of the substrate in a region between at least one pair of the isolation regions; forming a first region of a first dopant type in the substrate, the first region comprising a first edge aligned to a first edge of the first structure; and removing the first structure. The method further comprises forming a second region of a second dopant type in the substrate, the second region comprising a second edge aligned to a second edge of the first structure. Moreover, the method further comprises forming a first suicide layer comprising a first silicide edge aligned to the first edge of the first structure. Additionally, the method further comprises forming a second silicide layer comprising a second silicide edge aligned to the second edge of the first structure. The first structure comprises a hard mask, wherein the hard mask comprises a silicon nitride layer. Alternatively, the first structure comprises a gate and insulating spacers on opposite sides of the gate. Furthermore, in the removing step, the spacers remain on the substrate.

The invention provides a method of forming a self-aligned SOI diode, the method comprising depositing a protective structure over a substrate; implanting a plurality of diffusion regions of variable dopant types in an area between at least one pair of isolation regions in the substrate, the plurality of diffusion regions separated by a diode junction, wherein the implanting aligns an upper surface of the diode junction with the protective structure; and removing the protective structure. The method further comprises forming a silicide layer over the diffusion regions and aligned with the protective structure. The protective structure comprises a hard mask, wherein the hard mask comprises a silicon nitride layer. Alternatively, the protective structure comprises a polysilicon gate and insulating spacers on opposite sides of the gate. Furthermore, in the removing step, the spacers remain on the substrate.

The invention provides a method of forming a self-aligned silicon over insulator diode, the method comprising implanting an N-well doping region in an implant region in between isolation regions in a semiconductor substrate; configuring a gate over the implant region; configuring a pair of sidewall spacers on opposite sides of the gate; using the gate to define P+ and N+ contact regions in the implant region; removing the gate; and using the sidewall spacers to align a silicide layer over the P+ and N+ contact regions. The method further comprises defining a diode junction region in between the P+ and N− regions. Moreover, the method further comprises removing the sidewall spacers. Furthermore, the method further comprises depositing the suicide layer over the N-well doping region.

The structure provided by the invention eliminates the requirement for polysilicon to be used in the final diode structure, and is not a cost adder to the technology if gate removal techniques are already being used. Eliminating the need for a polysilicon gate in the diode structure removes the gate oxide breakdown limitation and reduces the capacitance loading of the diode. The method provided by the invention removes the polysilicon gate in the ESD diode after implant processing is completed. The diode provided by the invention is formed simply between the highly doped P+ source/drain region and the lightly doped N− body. the invention provides a self-aligned ungated diode.

These, and other, aspects of the invention will be better appreciated and understood when considered in conjunction with the following description and the accompanying drawings. It should be understood, however, that the following description, while indicating preferred embodiments of the invention and numerous specific details thereof, is given by way of illustration and not of limitation. Many changes and modifications may be made within the scope of the invention without departing from the spirit thereof, and the invention includes all such modifications.

BRIEF DESCRIPTION OF DRAWINGS

The invention will be better understood from the following detailed description with reference to the drawings, in which:

FIG. 9(c) is a schematic cross-sectional diagram of a completed diode structure according to a third embodiment of the invention;

FIG. 9(d) is a schematic cross-sectional diagram of a completed diode structure according to a fourth embodiment of the invention.

DETAILED DESCRIPTION

Figure 1:
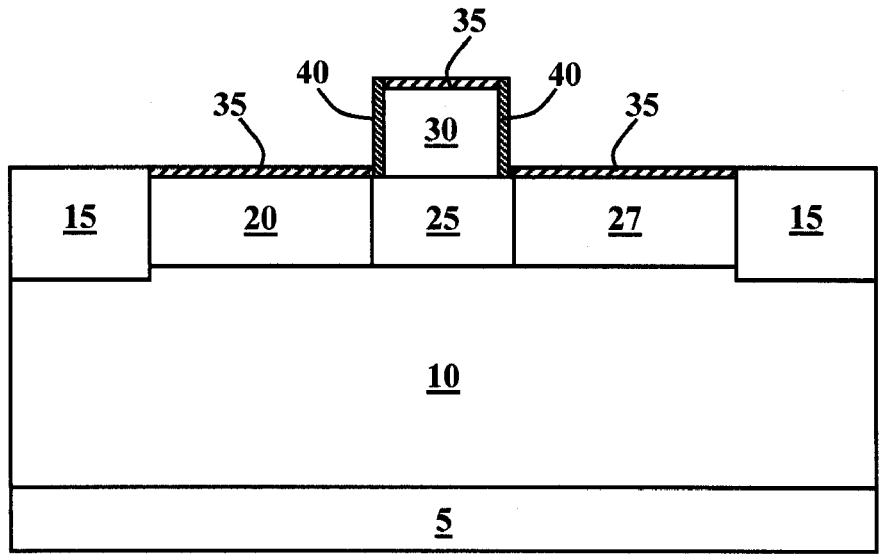
FIG. 1 is a schematic cross-sectional diagram of a prior art diode structure.
Figure 2:
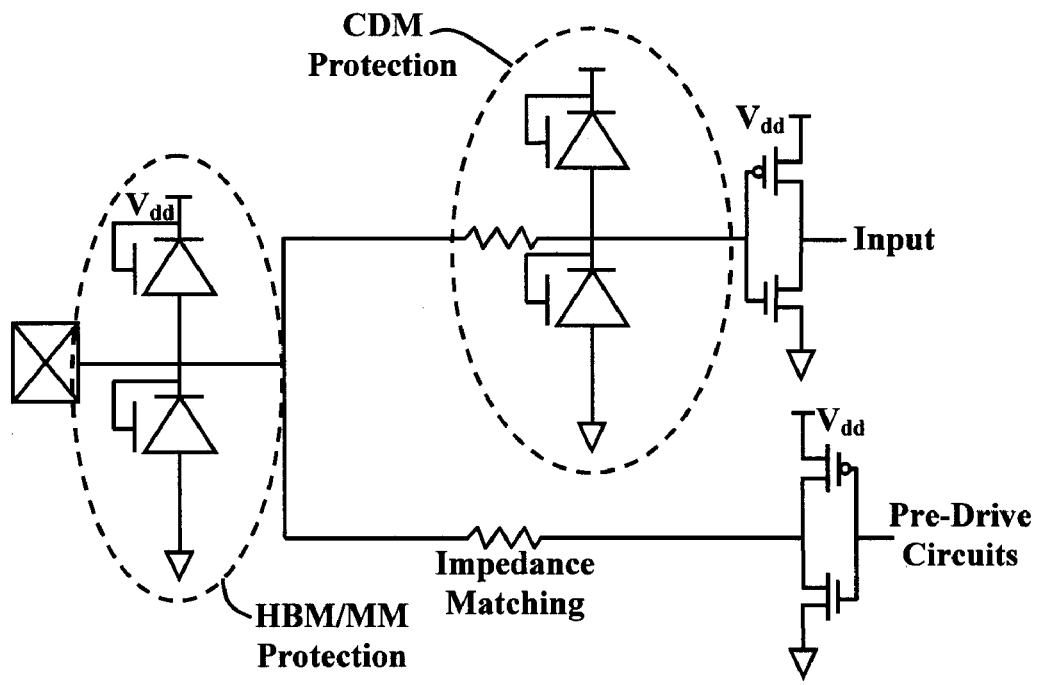
FIG. 2 is a schematic circuit diagram of a prior art diode-based ESD protection circuit.

The invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the invention. The examples used herein are intended merely to facilitate an understanding of ways in which the invention may be practiced and to further enable those of skill in the art to practice the invention. Accordingly, the examples should not be construed as limiting the scope of the invention.

As previously mentioned, there is a need for a novel method for processing a self-aligned low capacitance SOI ESD diode, which does not include a polysilicon gate in the final diode structure. Referring now to the drawings, and more particularly to FIGS. 3 through 10, there are shown preferred embodiments of the invention.

Figure 3:
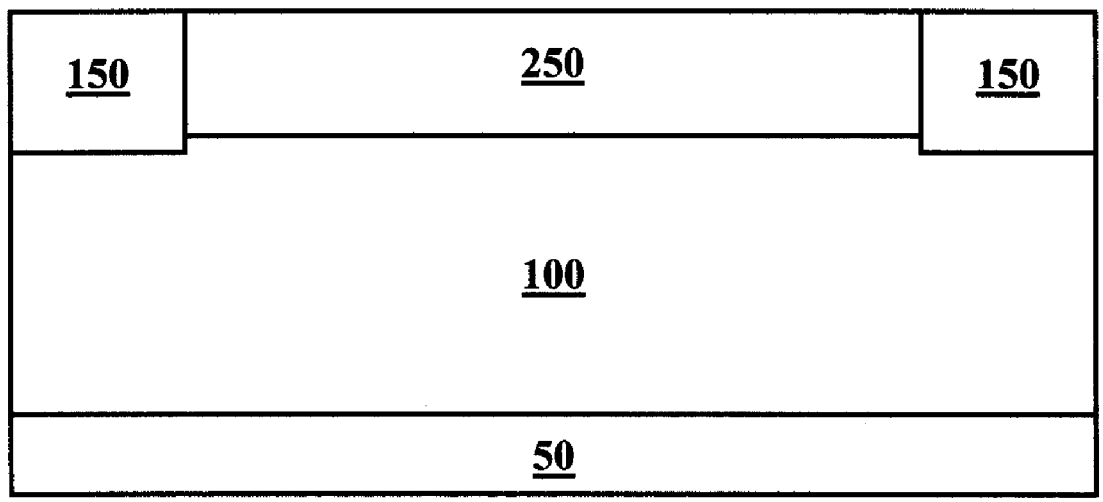
FIG. 3 is a schematic cross-sectional diagram of a partially completed diode structure according to a first embodiment of the invention.

FIGS. 3 through 10 illustrate the processing steps of a diode according to the invention. FIG. 3 shows a standard SOI wafer including an insulating layer 100, such as a buried silicon dioxide (BOX) layer over a bulk substrate 50, such as a P− or P+ substrate. Standard processing techniques are used to create shallow trench isolation regions 150, which isolates the diode from neighboring structures. An N-type silicon region 250 used for the PFET N-body is implanted over the insulating layer 100 using standard lithography and implantation processing. This implant could equally be the P-type used in an NFET P-body.

Figure 4:
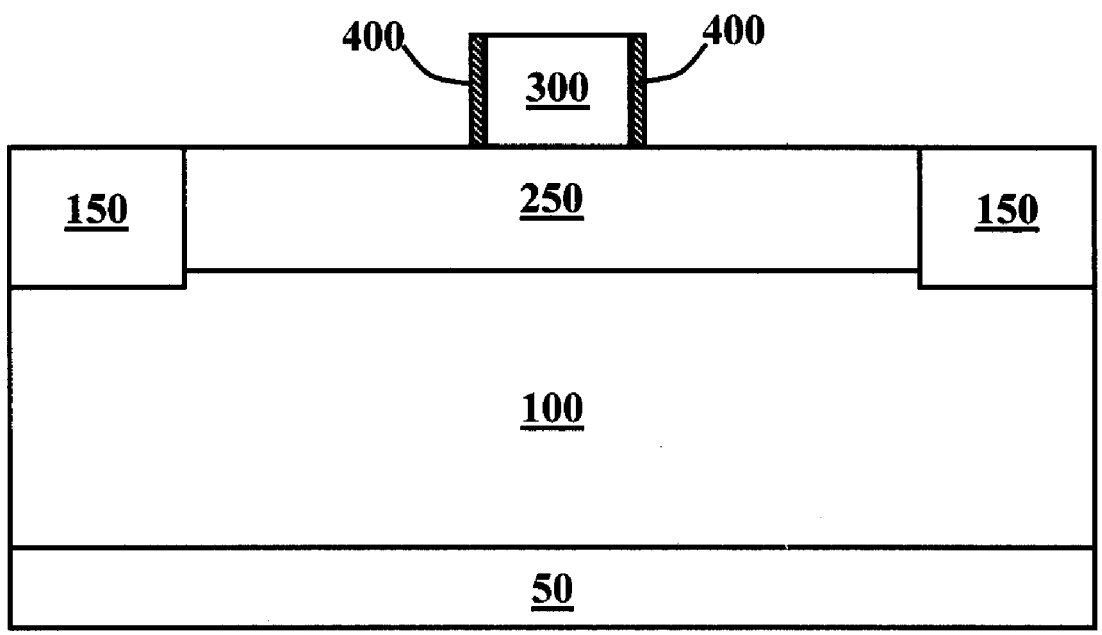
FIG. 4 is a schematic cross-sectional diagram of a partially completed diode structure according to a first embodiment of the invention.

In FIG. 4, a polysilicon layer is deposited over the N− implant 250 and STI regions 150, and using standard etching techniques is formed to create a polysilicon gate 300 over a portion of the N− implant region 250 to create a standard FET-like structure. Insulating spacers 400, preferably comprising an oxide deposited by chemical vapor deposition (CVD) are formed on opposite sides of the gate 300 to isolate gate contact and to passivate the sidewalls of the gate stack 300. Materials other than polysilicon could also be used to form this masking layer 300.

Figure 5:
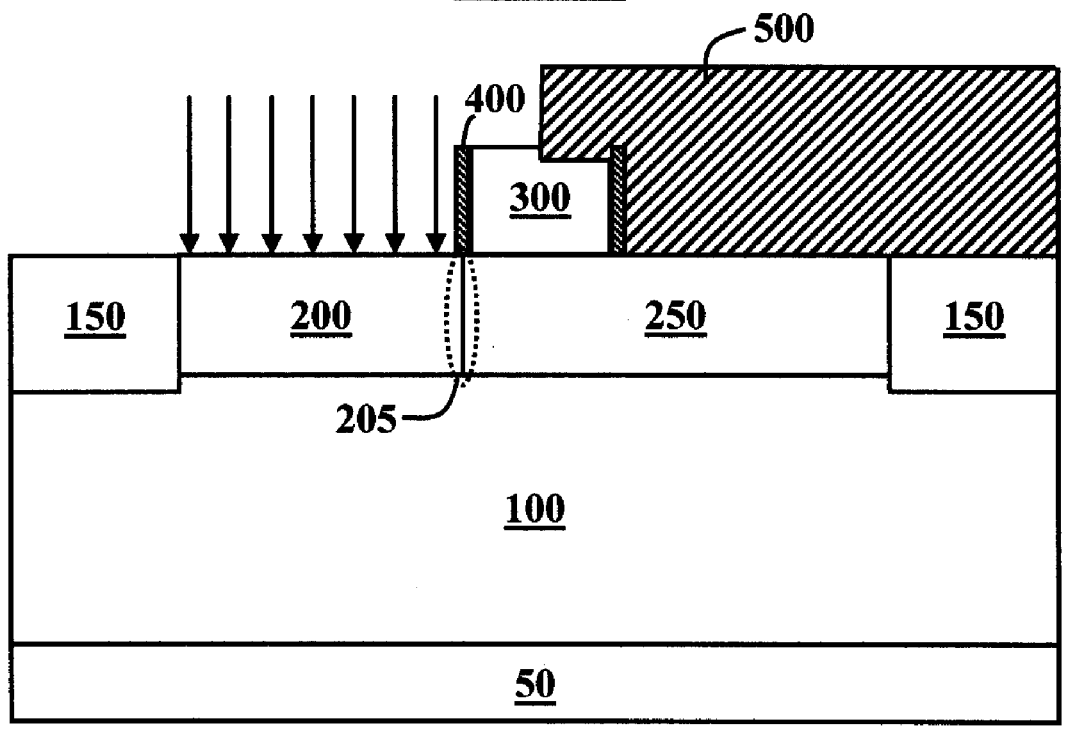
FIG. 5 is a schematic cross-sectional diagram of a partially completed diode structure according to a first embodiment of the invention.

As illustrated in FIG. 5, a photoresist mask 500 is deposited over one side of the diode structure and using standard lithography and implantation (represented by the arrows) techniques a P+ implant region 200 is formed on one side of the gate 300, which is used to create the eventual P+ anode region of the diode. The P+ and N− interface (diode junction 205) is located underneath the gate spacer 400 closest to the P+ region 200.

Figure 6:
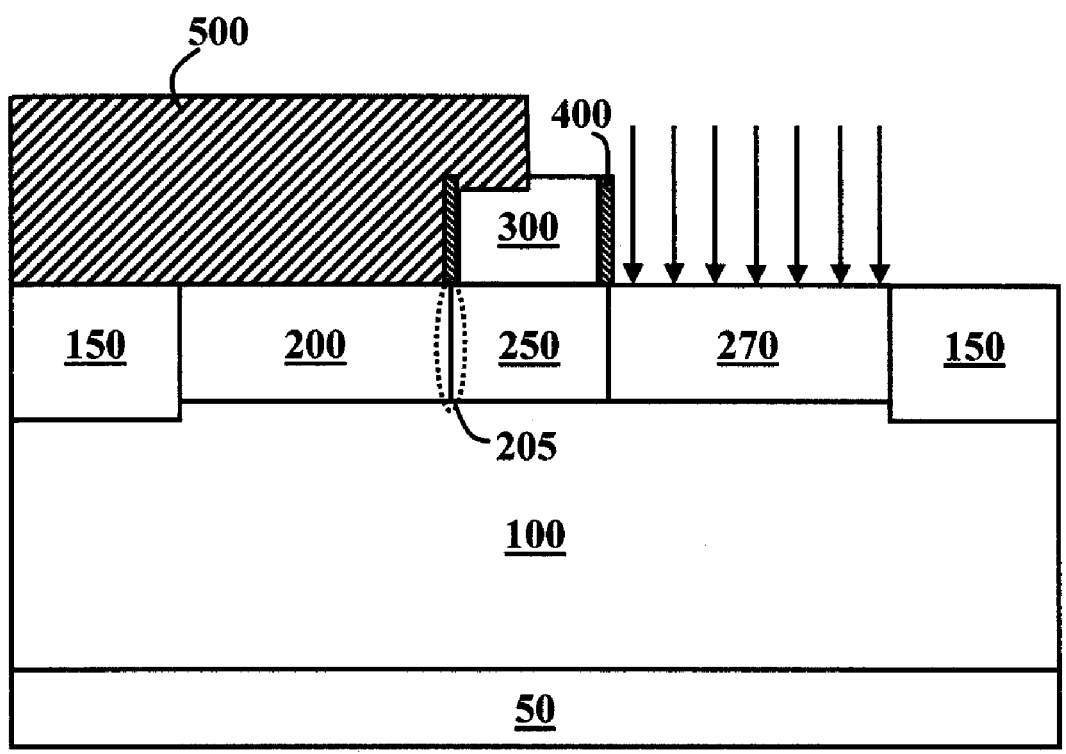
FIG. 6 is a schematic cross-sectional diagram of a partially completed diode structure according to a first embodiment of the invention.
Figure 7:
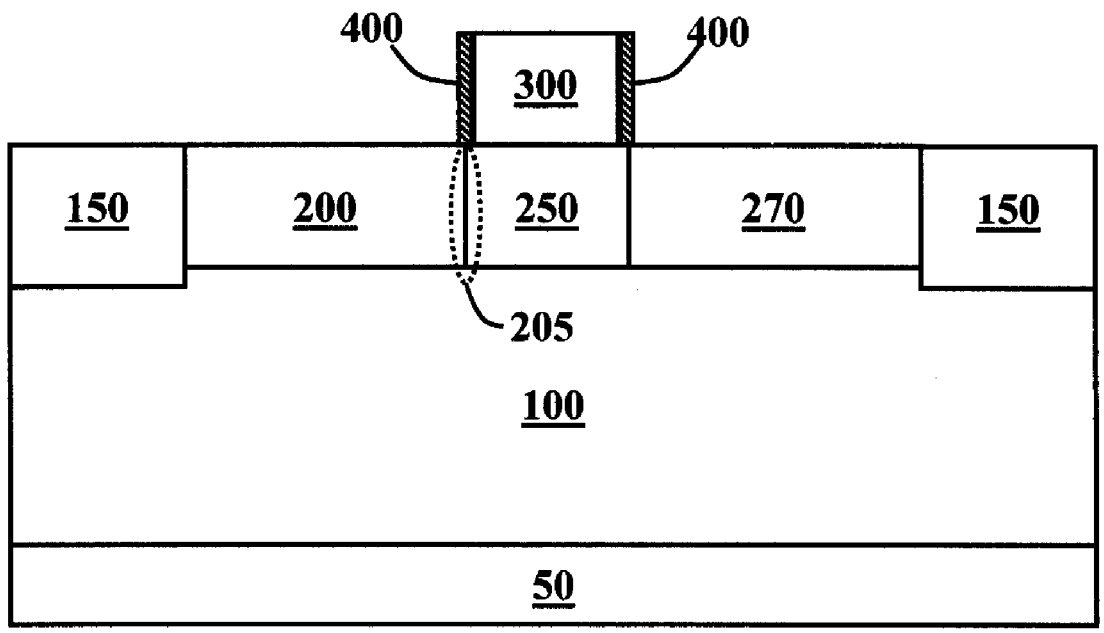
FIG. 7 is a schematic cross-sectional diagram of a partially completed diode structure according to a first embodiment of the invention.

Next, as depicted in FIG. 6, another photoresist mask 500 is deposited over the first side (P+ side) of the diode structure and using standard lithography and implantation (represented by the arrows) techniques an N+ implant region 270 is formed on the other side of the gate 300, which is used to create the eventual N+ cathode contact region of the diode. The N+ and N− contact interface is located underneath the gate spacer 400 closest to the N+ region 270. Thus, as illustrated in FIG. 6 there is a diode junction 205 located underneath the spacer 400. Therefore, the implant area of the diode includes a P+, N−and N+ region, 200, 250, 270, respectively, as illustrated in FIG. 7.

Figure 8:
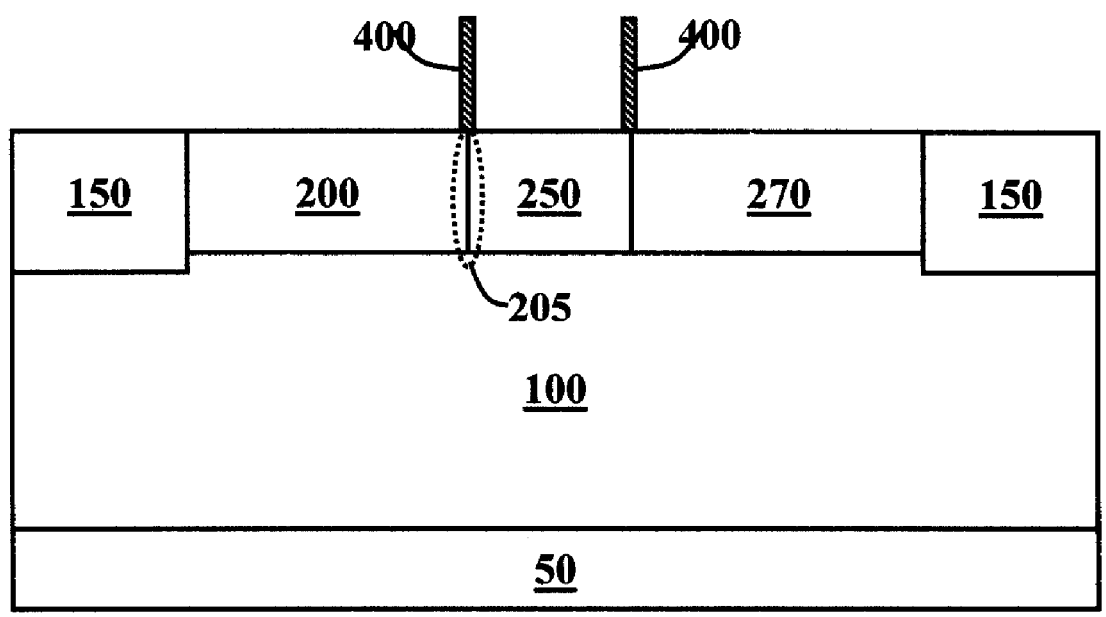
FIG. 8 is a schematic cross-sectional diagram of a partially completed diode structure according to a first embodiment of the invention.
Figure 9A:
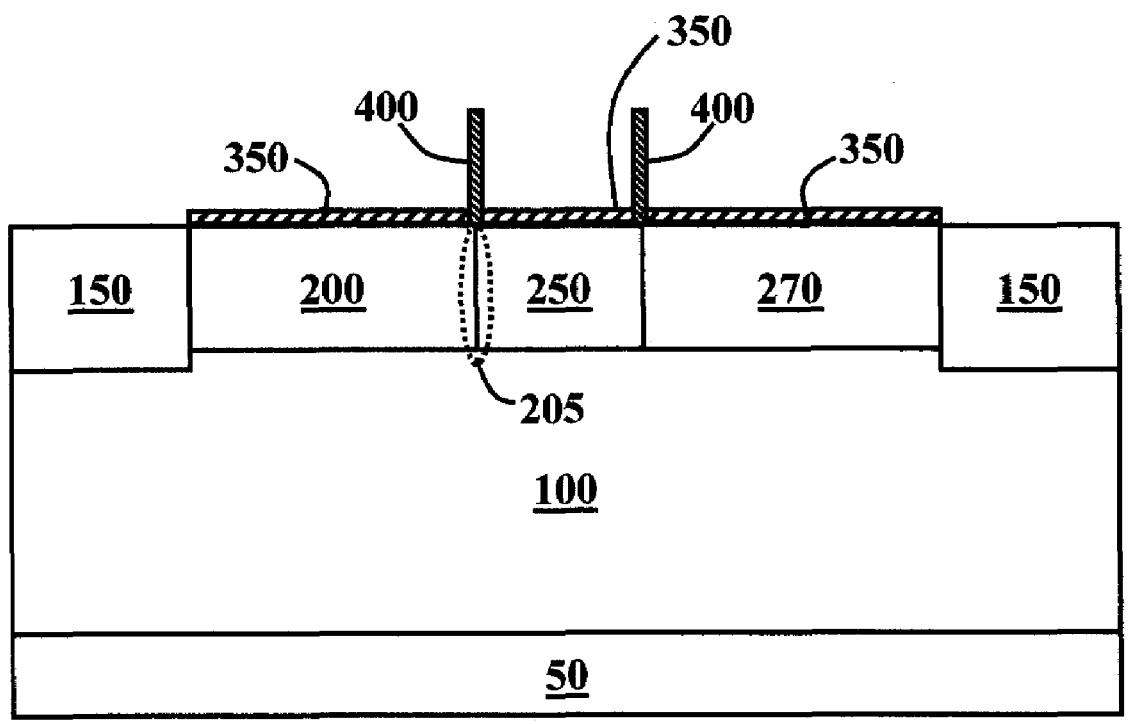
FIG. 9(a) is a schematic cross-sectional diagram of a completed diode structure according to a first embodiment of the invention.

As shown in FIG. 8, the wafer is patterned using standard lithography techniques in areas where the diode is being formed. As indicated, the polysilicon gate 300 is selectively etched in the areas where the diodes are being formed, leaving the spacers 400 intact. FIG. 9(a) illustrates a first embodiment of a completed diode structure according to the invention. In the first embodiment, presilicide cleaning processes are used to remove the remaining gate oxide from the device. Thereafter, a suicide layer 350 is deposited over the wafer using standard processes, with the spacers 400 remaining without suicide deposited thereon. The spacers 400 provide a break in the suicide 350 to prevent the shorting between the two diode terminals, P+ region 200 and the N+ region 270, at the diode junction 205.

Figure 9B:
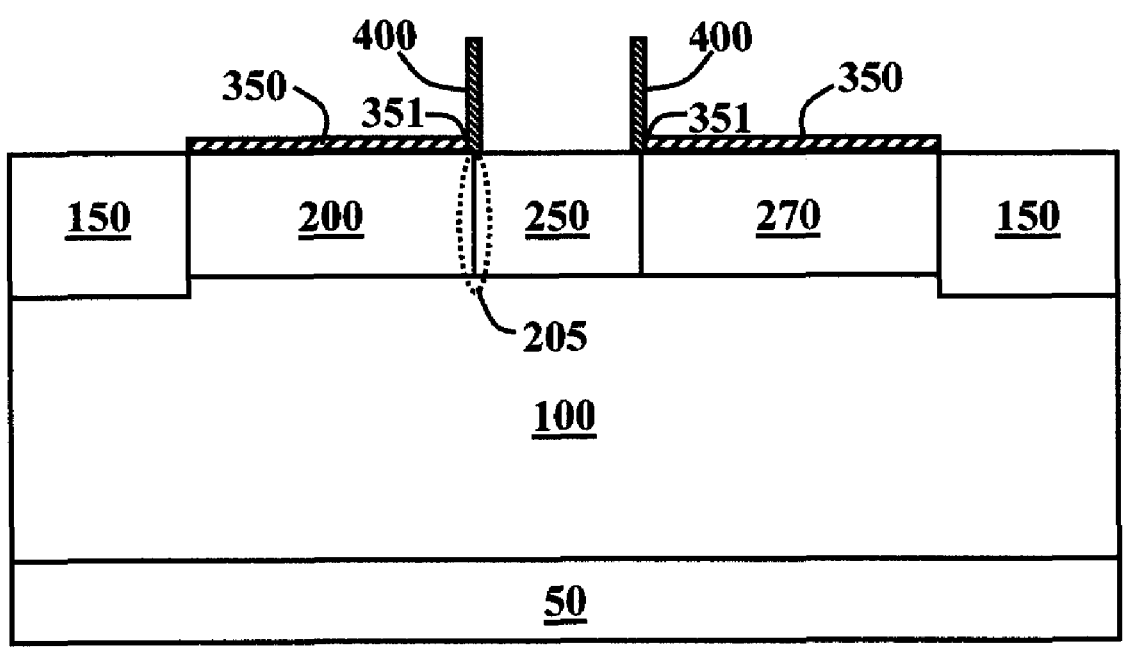
FIG. 9(b) is a schematic cross-sectional diagram of a completed diode structure according to a second embodiment of the invention.

FIG. 9(b) illustrates a second embodiment of a completed diode according to the invention, wherein the region in between the spacers 400, where the gate 300 had previously existed is cleaned of remaining silicide 350. Again, the spacers 400 prevent the silicide from shorting the two diode terminals. In FIG. 9(c), a third embodiment of a completed diode according to the invention is illustrated, wherein the silicide 350 is etched (i.e., "pulled away") from the spacers 400 to provide further prevention against shorting of the two diode terminals. This third embodiment includes retaining the spacers 400. However, the spacers 400 can also be removed with the silicide "pulled away" from the diode junctions 205, which would result in the completed device shown in the fourth embodiment of FIG. 9(d). If the spacers 400 are removed, then CA-level inter-level dielectric (not shown) would preferably fill that unoccupied space.

Figure 10:
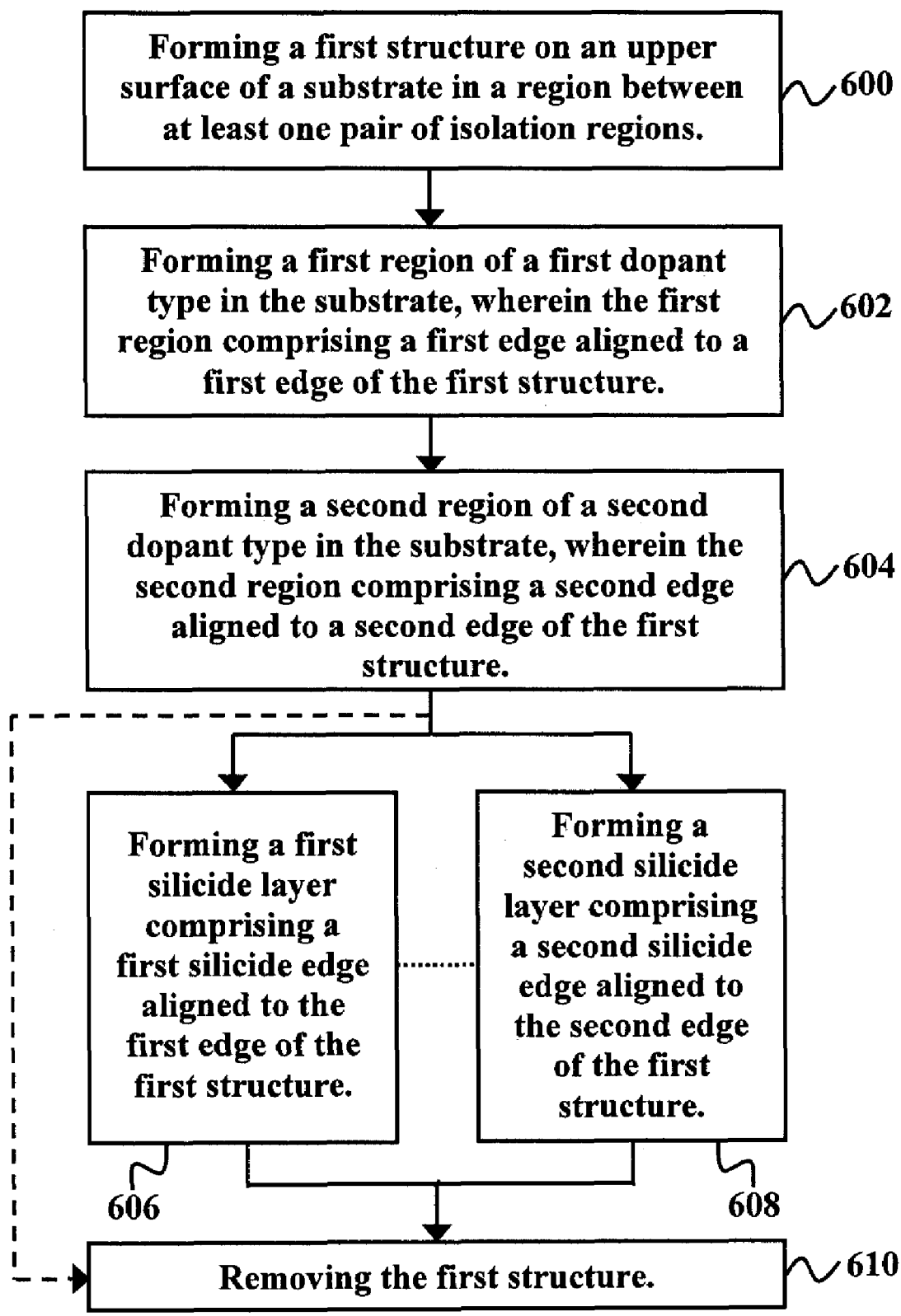
FIG. 10 is a flow diagram illustrating a preferred method of the invention.

As shown in FIG. 10, a flow diagram illustrating a preferred method of the invention is described. The method of forming a non-gated diode in a semiconductor substrate, wherein the substrate includes a plurality of isolation regions 150 formed therein, comprises the steps of forming 600 a first structure 300 on an upper surface 100 of a substrate 50 in a region between at least one pair of isolation regions 150. The next step involves forming 602 a first region 200 of a first dopant type in the substrate, wherein the first region 200 comprising a first edge 205 aligned to a first edge 400 of the first structure 300. Then, the invention forms 604 a second region 270 of a second dopant type in the substrate, wherein the second region 270 comprising a second edge 205 aligned to a second edge 400 of the first structure 300. After this, the next step involves forming 606 a first silicide layer 350 comprising a first silicide edge 351 aligned to the first edge 400 of the first structure 300. Thereafter, the subsequent step involves forming 608 a second silicide layer 350 comprising a second silicide edge 351 aligned to the second edge 400 of the first structure 300. Steps 606 and 608 preferably occur simultaneously as indicated by the dotted line in FIG. 10. Finally, the invention removes 610 the first structure 300. The step of removing 610 the first structure 300 may alternatively occur after the step of forming 604 the second region 270, as indicated by the dashed line in FIG. 10.

The invention achieves several advantages. First, the invention eliminates the concern of diode gate oxide breakdown, which allows the diode pad to reach a higher voltage without damage during an ESD event, thereby reducing the size of the diode connected to $V_{dd}$. In the case for stacked NFETs used in output devices, gate oxide breakdown in the diode is the limiting factor, and the invention overcomes this as indicated above. With the gate oxide breakdown eliminated, the area required for ESD could shrink, resulting in a 3% reduction in chip area in some cases. Capacitive loading could also be reduced by as much as 50%.

Again, the invention achieves these advantages by forming a diode on a single area of silicon between the STI regions 150. The polysilicon gate 300 is removed from the structure to avoid gate oxide breakdown concerns. The P+ region 200 and N+ region 270 are separated from one another to reduce leakage across the diode. Moreover, suicide 350 is formed on the P+, N-, and N+ regions 200, 250, 270, respectively; however spacers 400 provide a break in the suicide 350 to protect the underlying diode junction 205, which prevents shorting the anode and cathode of the diode, or the spacers 400 are removed and the silicide 350 is pulled away from the diode junctions 205 to prevent shorting of the device. According to the invention, the entire diode gets an N-well doping, and then the gate edges define the P+ and N+ contact regions before the gate 300 is removed. invention self-aligns the silicide 350 to the diode, because the spacers 400 that are formed on the sides of the gate 300 cause a break in the silicide 350.

Generally, the invention eliminates the requirement for polysilicon to be used in the final diode structure, and is not a cost adder to the technology if gate removal techniques are already being used. Eliminating the need for a polysilicon gate in the diode structure removes the gate oxide breakdown limitation and reduces the capacitance loading of the diode. Moreover, the invention removes the polysilicon gate in the ESD diode after implant processing is completed. The diode provided by the invention is formed simply between the highly doped P+ source/drain region and the lightly doped N-body. the invention provides a self-aligned, low capacitance, ungated diode.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the invention has been described in terms of preferred embodiments, those skilled in the art will recognize that the invention can be practiced with modification within the spirit and scope of the appended claims.

The invention claimed is:

1. A method of forming a non-gated silicon on insulator diode in a semiconductor substrate, the substrate including a plurality of isolation regions formed therein, said method comprising:
    forming a first structure on an upper surface of said substrate in a region between at least one pair of said isolation regions;
    forming a first region of a first dopant type in said substrate, said first region comprising a first edge aligned to a first edge of said first structure;
    forming a second region of a second dopant type in said substrate, said second region comprising a second edge aligned to a second edge of said first structure, said second region being of a different dopant type than said first region;
    removing said first structure.

2. The method of claim 1, further comprising:
    forming said first region and said second region in said region between said least one pair of isolation regions in said substrate and below said first structure;
    forming a diode junction in between said first region and said second region; and
    aligning an upper surface of said diode junction with said first structure.

3. The method of claim 1, further comprising forming a first suicide layer comprising a first suicide edge aligned to said first edge of said first structure.

4. The method of claim 1, further comprising forming a second suicide layer comprising a second suicide edge aligned to said second edge of said first structure.

5. The method of claim 1, wherein said first structure comprises a hard mask.

6. The method of claim 5, wherein said hard mask comprises a silicon nitride layer.

7. The method of claim 1, wherein said first structure comprises a gate.

8. The method of claim 7, wherein said first structure further comprises insulating spacers.

9. The method of claim 8, wherein in said removing step, said spacers remain on said substrate.

10. A method of forming a self-aligned SOI diode, said method comprising:
    depositing a protective structure over a substrate, wherein said protective structure comprises a polysilicon gate;
    implanting a plurality of diffusion regions of variable dopant types in an area between at least one pair of isolation regions in said substrate, said plurality of diffusion regions separated by a diode junction, wherein said implanting aligns an upper surface of said diode junction with said protective structure; and
    removing said protective structure.

11. The method of claim 10, further comprising forming a suicide layer over said diffusion regions and aligned with said protective structure.

12. The method of claim 10, wherein said protective structure comprises a hard mask.

13. The method of claim 12, wherein said hard mask comprises a silicon nitride layer.

14. The method of claim 10, wherein said plurality of diffusion regions of variable dopant types comprise:
    a first region comprising a first dopant type; and
    a second region comprising a second dopant type,
    wherein said first dopant type is a different dopant type than said second dopant type.

15. The method of claim 10, wherein said protective structure further comprises insulating spacers.

16. The method of claim 15, wherein in said removing step, said spacers remain on said substrate.

17. A method of forming a self-aligned silicon over insulator diode, said method comprising:
    implanting an N-well doping region in an implant region in between isolation regions in a semiconductor substrate;
    configuring a gate over said implant region;
    configuring a pair of sidewall spacers on sides of said gate;
    using said gate to define P+ and N+ contact regions in said implant region;
    removing said gate; and
    using said sidewall spacers to align a silicide layer over said P+ and N+ contact regions.

18. The method of claim 17, further comprising defining a diode junction region in between the P+ and N+ regions and the N+ and N+ regions.

19. The method of claim 17, further comprising removing said sidewall spacers.

20. The method of claim 17, further comprising depositing said suicide layer over said N-well doping region.

* * * * *